United States Patent [19]
Wright

[11] Patent Number: 5,264,740
[45] Date of Patent: Nov. 23, 1993

[54] PROGRAMMABLE VOLTAGE HYSTERESIS ON A VOLTAGE COMPARATOR

[75] Inventor: Michael J. Wright, Boulder, Colo.

[73] Assignee: Advanced Micro Devices, Inc., Sunnyvale, Calif.

[21] Appl. No.: 2,693

[22] Filed: Jan. 11, 1993

Related U.S. Application Data

[63] Continuation of Ser. No. 701,775, May 17, 1991, abandoned.

[51] Int. Cl.[5] ............................................. H03K 5/24
[52] U.S. Cl. .................................... 307/355; 307/359; 307/362
[58] Field of Search ............... 307/355, 359, 350, 362; 328/146, 148

[56] References Cited
U.S. PATENT DOCUMENTS

| | | | |
|---|---|---|---|
| 4,384,219 | 5/1983 | Davis | 307/359 |
| 4,602,169 | 7/1986 | Shimizu | 307/359 |
| 5,039,888 | 8/1991 | Bell et al. | 307/359 |

Primary Examiner—John Zazworsky
Attorney, Agent, or Firm—Fliesler, Dubb, Meyer & Lovejoy

[57] ABSTRACT

A programmable voltage comparator having a programmable hysteresis function controlling the comparator's output relative to first and second comparator input voltage variables. The programmable voltage comparator comprises an inverting and non-inverting input for receiving a first and second input voltages and an output providing a logic state signal reflecting the amplitude of the inverting and non-inverting input voltages. The comparator includes level shift circuitry coupled to the inverting and non-inverting inputs for programmably shifting the amplitude of the voltages applied to the inverting and non-inverting inputs responsive to the logic state output of the comparator. In one embodiment, the comparator includes a differential amplifier having inverting and non-inverting outputs, wherein the level shift circuitry comprises a first level shift circuit coupled to the non-inverting voltage input and having a feedback element coupling to the non-inverting output. A second level shift circuit is coupled to the inverting input with a feedback element coupled to the inverting output.

24 Claims, 4 Drawing Sheets

PROGRAMMABLE VOLTAGE HYSTERESIS ON A VOLTAGE COMPARATOR

This application is a file wrapper continuation of Ser. No. 07/701,775, filed May 17, 1991, now abandoned.

BACKGROUND OF THE INVENTION

1. Field of the Invention

The invention relates to analog voltage comparators and means for selectively controlling the output of the comparator responsive to the input voltages.

2. Description of the Related Art

Comparators are well-known analog electronic devices having a variety of applications. Generally, a comparator has only two logic state outputs, each state reflecting the relative amplitudes of two analog input variables. The analog input variables are typically termed reference input (or inverting input) and test input (or non-inverting input). Usually, the comparator outputs a logic level HIGH state when the amplitude of the inverting input variable is less than the amplitude of the non-inverting input variable. Conversely, the typical comparator outputs a logic level LOW state when the inverting input variable is greater than the noninverting input variable.

A typical comparator may comprise an amplifier specifically designed for null comparison measurement. In many practical applications, the reference and test input variables to a comparator are subject to signal disruptions such as noise or oscillation. These signal disruptions can cause unwanted state changes in the logic state output of a comparator. A Schmitt-trigger is a well-known analog circuit which also includes a two-state logic output, and is often utilized to overcome input signal noise since Schmitt-triggers have different switching thresholds, depending on whether the input is changing from LOW to HIGH or from HIGH to LOW. The difference between the switching thresholds is generally termed hysteresis.

The programmable voltage comparator of the present invention utilizes hysteresis to reduce the effect of these small oscillatory changes of the comparator's input variables on the comparator's output.

As noted above, differential amplifiers are ideally suited for providing the comparator function in solid-state circuitry. Various circuit techniques are well known in the art for providing feedback from the output of a comparator to adjust the switching states of the comparator's output responsive to the input variables. However, to the best of Applicant's knowledge, no such circuit technique exists for providing a programmable means for adjusting the input voltage required to initiate a switching of the output state of the comparator.

SUMMARY OF THE INVENTION

The invention comprises a programmable voltage comparator having a programmable hysteresis function for adjusting the comparator output switching thresholds relative to first and second comparator input voltage variables. The programmable voltage comparator comprises an inverting and non-inverting input for receiving a first and second input voltages and an output means for providing a logic state signal reflecting the amplitude of the inverting and non-inverting input voltages. The comparator includes level shift circuitry coupled to the inverting and non-inverting inputs for programmably shifting the amplitude of the voltages applied to the inverting and non-inverting inputs responsive to the logic state output of the comparator.

In the preferred embodiment of the invention, the comparator comprises a differential amplifier having inverting and non-inverting outputs, wherein the level shift circuitry comprises a first level shift circuit coupled to the non-inverting voltage input and having a feedback element coupled to the non-inverting output. Likewise, a second level shift circuit is coupled to the inverting input with a feedback element coupled to the inverting output. The first level shift circuit programmably decreases the voltage applied to the non-inverting input when the non-inverting output state is a logic level LOW, thereby increasing the positive voltage swing which must be applied to the non-inverting input voltage means to initiate a change in the comparator logic level output state. Likewise, the second level shift circuit decreases the voltage which is applied to the inverting input when the inverting output is in logic level LOW state thereby increasing the negative voltage swing which must be applied to the non-inverting input to initiate a change in the logic state output of the comparator.

BRIEF DESCRIPTION OF THE DRAWINGS

The invention will be described with respect to the particular embodiments thereof. Other objects, features and advantages of the invention will become apparent with reference to the specification and drawings in which:

FIG. 6A is a schematic diagram of a second embodiment of the logic shift circuitry utilized in the preferred embodiment of the analog comparator shown in FIG. 2.

DETAILED DESCRIPTION OF THE INVENTION

The invention will be described herein with reference to the preferred embodiments, however, it should be understood that numerous variations and modifications will be understood by those skilled in the art as within the context of the invention.

Figure 1:
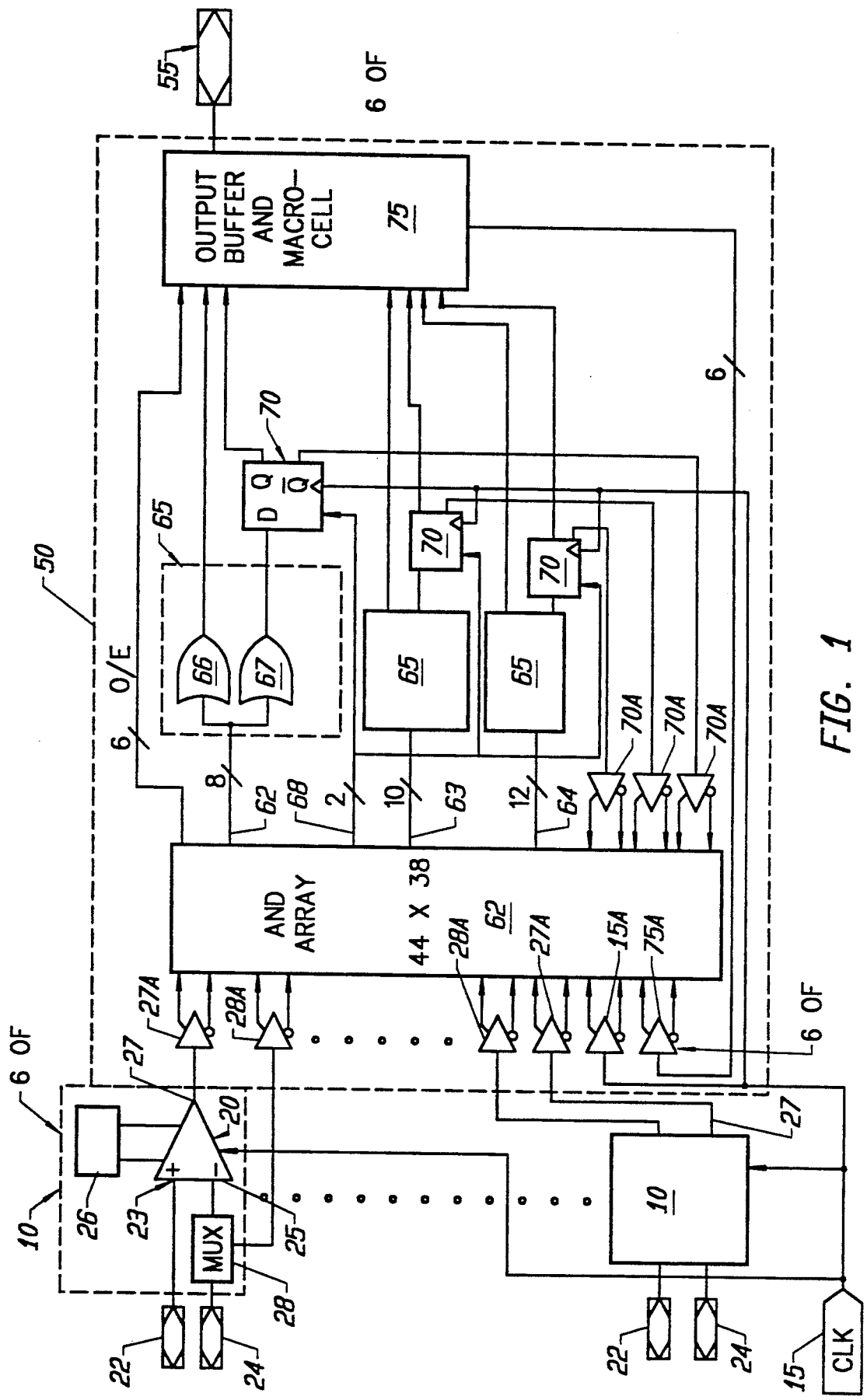
FIG. 1 is a chip-level block diagram of the integrated circuit of the present invention.

The integrated circuit shown in FIG. 1 includes six analog functional elements 10 providing inputs to a programmable combinatorial array 50. The programmable combinatorial array 50 includes a programmable AND array 60 which provides output terms (62, 63, 64) to an output logic array comprising three pairs of OR gates 65. The output logic array provides registered and combinatorial outputs to six device output pins 55 via an output buffer 75. The analog functional elements 10, in combination with the programmable logic circuitry, combinatorial array 50 and output logic 65, 75, provide a device which combines analog device functionality with the programmability and usefulness of digital logic on a single chip. Specifically, the programmable logic device of the present invention combines the functions of a programmable array logic device (PAL) with the functions of a comparator to produce a versatile device for usein both analog and analog-to-digital interface applications.

In one aspect of the invention, eaoh comparator 20 includes internally programmable hysteresis. These voltage comparators are useful in zero cross detection, frequency doubling, voltage controlled oscillators, line driving and receiving operations, and magnetic pickup detection. These functions are combined on a single integrated circuit device with the programmability and versatility of a PAL capable of performing digital functions from analog inputs, thereby yielding single analog-to-digital input comparisons, digital function outputs from zero cross detections, and analog-to-digital conversions.

Each analog functional element 10 includes programmable voltage comparator 20, test voltage $V_{i(+)}$ (non-inverting) input pin 22 coupled to a non-inverting comparator input 23, and reference voltage $V_{i(-)}$ (inverting) input pin 24, coupled via multiplexer 25 to inverting comparator input 25. Analog comparator 20 includes an output 27 which provides a logic state signal input to programmable combinatorial array 50. Specifically, output 27 is coupled to input buffer 27a which provides the logic state signal on output 27 and its complement to programmable AND array 60.

Analog comparator 20 is coupled to programmable hysteresis circuit 26 which programs output 27 of comparator 20 to exhibit a hysteresis effect with respect to a test voltage applied to non-inverting input 23. Programmable hysteresis circuit 26 allows the chip user to program a hysteresis function into comparator 20. The programmable hysteresis function sets the switching thresholds of comparator 20 such that a high/low output voltage transition occurs when the test input voltage $V_{i(+)}$ is at a first amplitude and low/high output voltage logic state transition occurs when test input voltage $V_{i(+)}$ is at a second amplitude. FIG. 1 depicts programmable hysteresis circuit 26 as an onchip circuit as part of analog functional element 10. However, it is within contemplation of the invention to provide programmable hysteresis circuit 26 as an off-chip element. The practical applications and preferred embodiments for implementing programmable hysteresis circuit 26 are discussed in further detail below with respect to FIGS. 2-6.

Multiplexer 28 allows inverting input pin 24 to be configured in two distinct ways. In one alternative, input pin 24 comprises the normal inverting input 25 to the comparator 20. In another alternative, inverting input pin 24 is coupled to input buffer 28a and acts as a direct digital input, providing a logic state signal and its inverse to the programmable combinatorial array 50. In the digital array input mode, the inverting input voltage $V_{i(-)}$ is set to an internal reference value midway between analog element supply voltages $V_{s(+)}$ and $V_{s(-)}$. Further, when inverting input pin 24 is in the digital array input mode, non-inverting input pin 22 can be configured as either an analog or digital input, depending upon the application. In either case, inverting input voltage $V_{i(-)}$ is a fixed reference. Still further, in the case where non-inverting input pin 22 is configured as a digital input, if hysteresis is programmed into comparator 20 (as discussed below), non-inverting input 22 will act as a conventional Schmitt-trigger input to combinatorial array 50.

As noted above, programmable combinatorial array 50 comprises programmable AND array 60, fixed input OR array comprising three pairs of OR gates 65, an output block comprised of a number of D-type flip-flops 70, and programmable output buffer/macrocell 75.

Programmable AND array 60 includes 44 input terms comprising 22 signal inputs and their complements. The 22 input signals comprise six analog element 10 outputs, one clock/strobe input 15, six reference voltage inputs from multiplexer 28, three inputs from registers 70, and six inputs from output buffer/macrocell 75.

The product term outputs of AND array 60 are configured to comprise inputs to the fixed input OR plane (62, 63, 64), act as SET/RESET triggers 68 for flip flops 70, and act as output enable (O/E) signals to output buffer/macrocell 75.

The product term outputs configured as inputs to the fixed OR array are grouped into three sets 62, 63, 64, corresponding to three pairs 65 of OR gates 66, 67 comprising the fixed OR plane. Each OR gate pair 65 shares either first product term set 62, second product term set 63, or third product term set 64 comprised of eight, ten, or twelve product term outputs, respectively.

The output of OR gate 66 is combinatorial and the output of OR gate 67 is registered. In one configuration, when one of the product terms in the first 62, second 63, or third 64 product term set is programmed to give a function to either OR gate 66 or 67, that particular product term cannot be programmed to provide a functional output from the other OR gate in a particular OR gate pair 65. While it is technically possible to drive both inputs, this orientation provides a faster configuration for the PLD. This use of product term sharing allows the distribution of product terms to be better organized thereby yielding less overall redundancy. The same functionality in conventional PAL architecture would require an array twice the size, because each output would require its own set of product terms. Further, pairing of combinatorial (OR gate) 66 and registered (OR gate) 67 outputs using product term sharing allows up to three analog functional elements 10 to be programmed as individual, combinatorial voltage comparators with the use of an input strobe signal on clock input line 15. In such an arrangement, each OR gate output uses one product term, leaving the remaining shared terms for the registered output. This gives the device the versatility to perform integrated analog/digital solutions, and mix analog and digital solutions in applications with the availability of individual comparators.

Clock input line 15 couples a clock/strobe signal to programmable voltage comparator 20, programmable AND array 60 (via input buffer 15a), and programmable output buffer 75. The signal on clock input line 15 allows the device programmer to latch the output state of comparator 20. This feature is useful when the programmable logic device is to be used as a sample-and-hold and-hold circuit, where clock input line 15 is linked to the switches of the sampling circuit. Clock input 15 also supplies a clock signal to the edge-triggered D-type flip-flops (output registers) 70 of array 50.

One problem associated with the use of an analog voltage comparator in the device is a resulting increased load to the programmable logic device's analog supply voltage ($V_s$) resulting from changes in the voltage level of output 27. The increased load can alter reference voltage $V_{i(-)}$, thereby causing oscillation of the comparator,s output signal and incongruous inputs to the programmable AND array 60.

The input signal on clock input line 15 can be used to maintain the stability of the programmable logic device during high-speed operation. If the enable time of the signal is shorter than the total signal propagation delay through the differential input stage 35 of voltage comparator 20, (see FIG. 2 and accompanying description), then the input to the differential stage 35 will be "frozen" before any voltage change in the output of programmable logic device occurs as a result of the comparison.

The programmable hysteresis function of the comparator, discussed below with reference to FIGS. 2-6 is another method of overcoming input signal oscillations, but the effect of the positive feedback used therein can cause time penalties at high speed.

Also shown in FIG. 1 are D-type flip-flop registers 70 having data inputs to the outputs of OR gate 67, and including non-inverting Q and inverting $\overline{Q}$ outputs. For each flip-flop 70, non-inverting output Q is coupled to output buffer 75 and inverting output $\overline{Q}$ is coupled via an input buffer 70a as an input to AND array 60. Two outputs of AND array 60 comprise PRESET and RESET signals via output lines 68 to flip-flops 70. The clock inputs of flip-flops 70 are also coupled to the clock input line 15 as discussed above.

Programmable output buffer/macrocell 75 allows the user to selectively provide the OR array outputs to six device pins 55. Typically, output buffer/macrocell 75 includes a plurality of multiplexers to selectively couple each device pin 55 to a plurality of input buffers 75a allowing pins 55 to be used as direct inputs to AND array 60. As is shown in FIG. 1, the combinatorial output of OR gate 66 and the registered output of OR gate 67 (via register 70) are coupled to output buffer 75. Six product term outputs of AND array 60 comprise output enable signals (OE) input to output buffer/macrocell 75. Output buffer/macrocell 75 thereby allows device pins 55 to be used as outputs from, or as inputs to, the programmable logic device. During the programming state, the user selects the output drive required for the particular application of the programmable logic device. Output buffer/macrocell 75 has the capability of dedicating each OR array output as an open collector or a totem pole, although use as an open collector can be utilized only when each device pin 55 is defined as a dedicated output.

Figure 2:
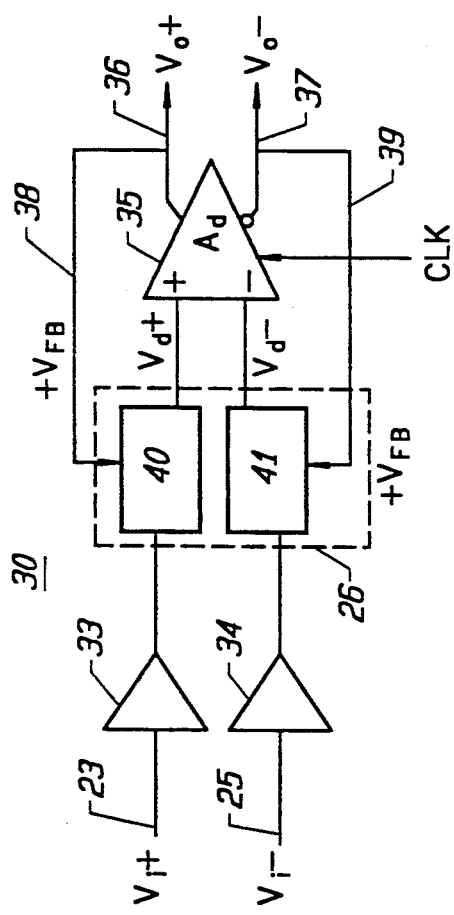
FIG. 2 is a block diagram of the preferred embodiment of the analog voltage comparator utilized in the present invention.

FIG. 2 is a block diagram showing programmable voltage comparator 30 which may be utilized as an alternative to programmable voltage comparator 20 and programmable hysteresis circuit 26 shown in FIG. 1. It should be noted that programmable voltage comparator 30 shown in FIG. 2 includes differential gain amplifier 35 which has both non-inverting output 36 and inverting output 37 for supplying non-inverting output voltage $V_{o(+)}$ and inverting output voltage $V_{o(-)}$, respectively. Thus, the need for input buffer 27a (shown in FIG. 1) is eliminated when programmable voltage comparator 30 is utilized in the programmable logic device.

Figure 5:
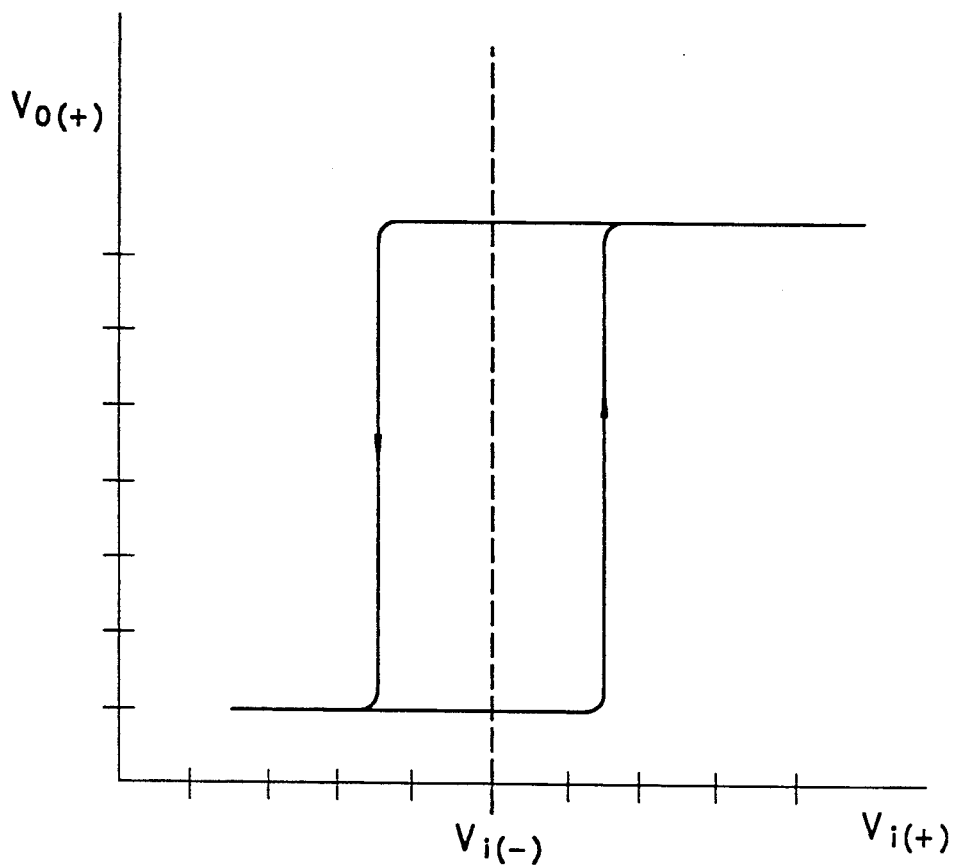
FIG. 5 is a graphic representation of the hysteresis effect of the output voltage $V_0$ versus the test input voltage $V_{i(+)}$ of the voltage comparator.

A typical analog voltage comparator outputs a first voltage level representing a logic level HIGH output when the voltage applied to its test (non-inverting) input exceeds the voltage applied to its reference (inverting) input, and a second voltage level representing a logic level LOW output when the test voltage is less than the reference voltage. Both programmable voltage comparators 20 (FIG. 1) and 30 (FIGS. 2 and 6) utilized in the device allow for user-programmable hysteresis to generate an output as shown in FIG. 5. FIG. 5 reflects the condition whereby the test voltage required to initiate a logic level LOW-to-HIGH transition on the comparator output is greater than the test voltage required to initiate a logic level HIGH-to-LOW transition.

Essentially, programmable hysteresis circuit 26, shown in FIG. 2, moves the true comparison reference voltage $V_{i(-)}$ of programmable voltage comparator 30 to a lower apparent level such that input test signal $V_{i(+)}$ must exceed both the true reference level and the apparent reference levels ($V_{i(-)} + V_H$) to produce an output change. For purposes of this specification, the difference between the true and the apparent input voltages is termed the hysteresis voltage $V_H$. The effect of hysteresis on the output voltage is shown in FIG. 5 which is a plot of output voltage $V_{o(+)}$ as a function of the non-inverting voltage $V_{i(+)}$.

As shown in FIG. 2, programmable voltage comparator 30 includes non-inverting voltage $V_{i(+)}$ input 23, and inverting voltage $V_{i(-)}$ input 25 for receiving a test voltage and a reference voltage, respectively. Non-inverting input 23 and inverting input 25 are coupled to input buffers 33 and 34. The output of each input buffer 33 and 34 is coupled to level shift circuits 40 and 41 which generate output voltages $V_{d(+)}$ and $V_{d(-)}$, respectively, proportional to input voltages $V_{i(+)}$ and $V_{i(-)}$. Level shift output voltages $V_d$ are input to differential gain stage amplifier 35.

Non-inverting output 36 of differential, amplifier 35 is coupled by a feedback line 38 to level shift circuit 40. Likewise, differential amplifier inverting output 37 is coupled by a feedback line 39 to level shift circuit 41. Feedback lines 38 and 39 supply feedback voltages $V_{fb(+)}$ and $V_{fb(-)}$ to level shift circuits 40 and 41, which cause level shift circuits 40 and 41 to vary output voltages $V_{d(+)}$ and $V_{d(-)}$ responsive to the state of the output voltages $V_{o(+)}$ and $V_{o(-)}$ of differential amplifier 35. As discussed in detail below, by varying the levels of $V_{d(+)}$ and $V_{d(-)}$, the desired hysteresis effect is achieved. Differential amplifier 35 also includes a clock signal input for receiving the signal on clock/strobe input line 15.

The switching of voltage comparator 30 of the present invention, and the effect of the level shift circuits 40 and 41 thereon, will be described herein with reference to FIGS. 3A, 3B, 4A and 4B.

Figure 3A:
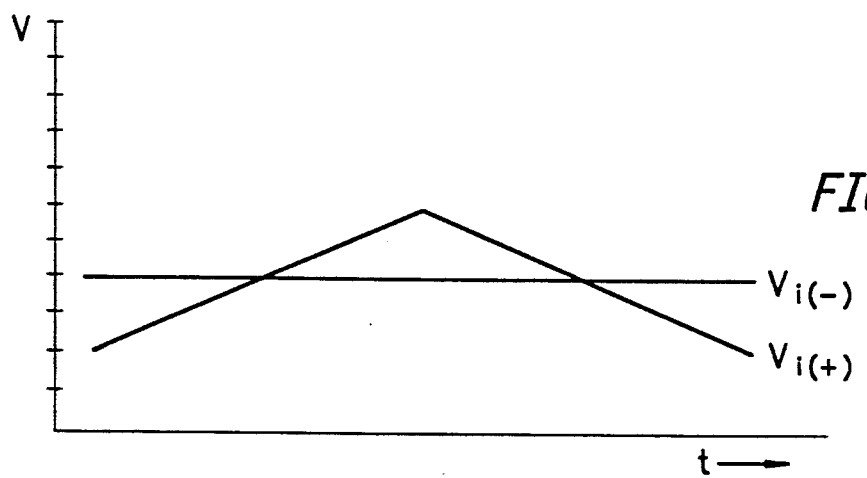
FIG. 3A is a graphic representation of the test (non-inverting) input voltage $V_{i(+)}$ and the reference (inverting) input voltage $V_{i(-)}$ versus time in a typical analog voltage comparator.
Figure 3B:
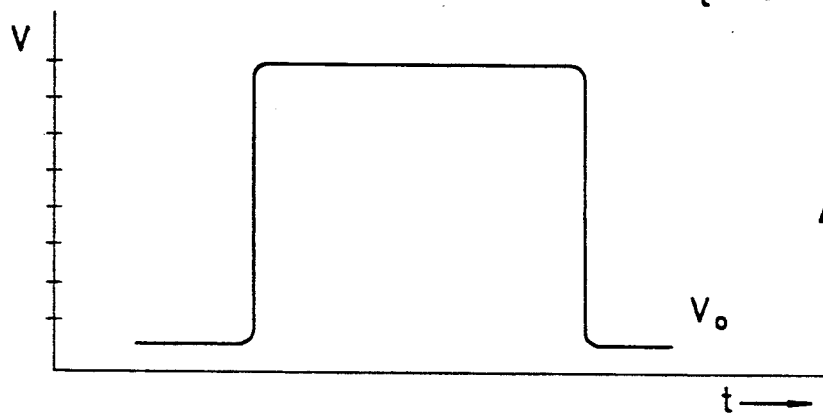
FIG. 3B is a graphic representation of the output voltage $V_0$ of a typical analog voltage comparator with reference to FIG. 3A and the test and reference voltages.

FIGS. 3A and 3B represent the input voltage and output voltage relationships for a typical comparator. FIG. 3A is a graph of input voltages $V_{i(+)}$ and $V_{i(-)}$ in relation to time. FIG. 3B shows the value of output voltage $V_0$ corresponding to the input voltage values shown in FIG. 3A. Comparing FIGS. 3A and 3B, one notes that output voltage $V_0$ is at a logic level LOW state ($-V_s$) at all points where test voltage $V_{i(+)}$ is less than reference voltage $V_{i(-)}$. Output voltage $V_0$ achieves a logic level HIGH state ($+V_s$) at all times when test voltage $V_{i(+)}$ exceeds reference voltage $V_{i(-)}$. As will be understood following the discussion below, FIGS. 3A and 3B also describe the situation wherein programmable fuses 43 are set such that inverting amplifier 42 (FIG. 6) is programmed such that the programmable hysteresis circuit 26 exhibits no effect on output voltages $V_{d(+)}$ and $V_{d(-)}$.

Figure 4A:
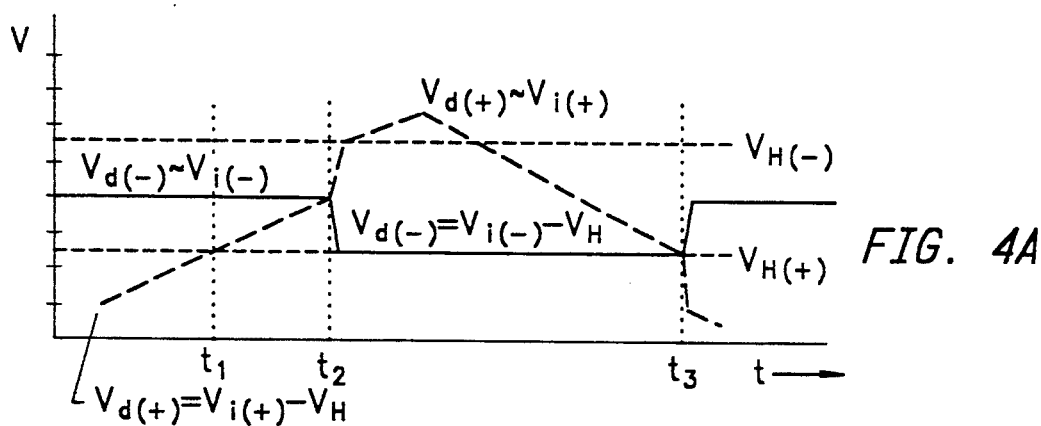
FIG. 4A is a graphic representation of the test (non-inverting) input voltage $V_{i(+)}$ and the reference (inverting) input voltage $V_{i(-)}$ versus time in the preferred embodiment of the analog voltage comparator utilized in the present invention.
Figure 4B:
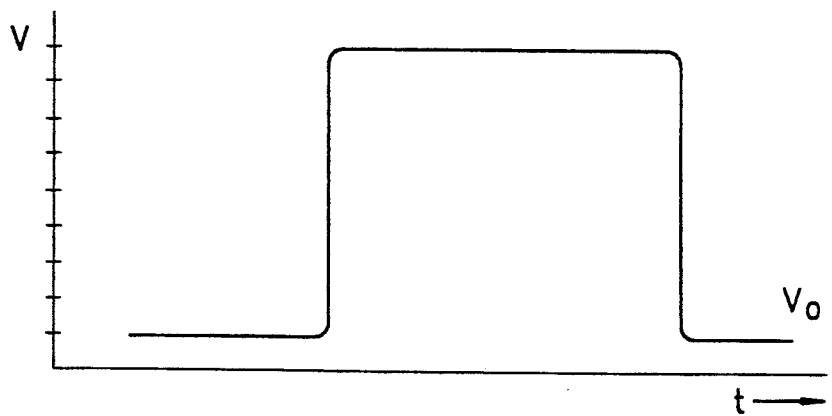
FIG. 4B is a graphic representation of the output voltage $V_0$ with reference to the input voltages of FIG. 3A for the preferred embodiment of the analog voltage comparator of the present invention.

FIGS. 4A and 4B graphically show the effect of level shift circuits 40 and 41 on outputs 36,37 of programmable voltage comparator 30 of the present invention. FIG. 4A is a graph of level shift circuit output voltages $V_{d(+)}$ and $V_{d(-)}$ versus time. FIG. 4B is a graph of comparator output voltage $V_{o(+)}$ corresponding to differential stage input voltages (and level shift output voltages) $V_{d(+)}$ and $V_{d(-)}$. FIGS. 4A and 4B are shown in relation to the switching states of a typical comparator based on input voltages $V_{i(+)}$ and $V_{i(-)}$ shown in FIG. 3A.

In the comparator waveforms shown in FIGS. 3A and 3B, output voltage $V_0$ changes at the point where $V_{i(+)}$ equals $V_{i(-)}$; in comparator 30 output state switching occurs when $V_{d(+)}$ equals $V_{d(-)}$. When no hysteresis is present, $V_{d(+)}$ and $V_{d(-)}$ will be proportional to $V_{i(+)}$ and $V_{i(-)}$, respectively. In the presence of hysteresis, level shift circuits 40 and 41 act as follows: when output voltage $V_{o(+)}$ is at a logic level HIGH state, inverted output $V_{o(-)}$ and $V_{fb(-)}$ are at a logic level LOW state and $V_{d(+)}$ remains at a level proportional to $V_{i(+)}$ while level shift circuit 41, responsive to $V_{fb(-)}$, decreases $V_{d(-)}$ by a value of $V_H$; correspondingly, when output voltage $V_{o(+)}$ and $V_{fb(+)}$ are logic level LOW and the inverted output voltage $V_{o(-)}$ is logic level HIGH, level shift circuit 40, responsive to $V_{fb(+)}$ decreases $V_{d(+)}$ by a value of $V_H$.

With reference to FIG. 4A, at time $t_1$ output voltage $V_{o(+)}$ is at a logic level LOW and inverted output voltage $V_{o(-)}$ is a logic level HIGH. $V_{fb(+)}$ is also LOW causing $V_{d(+)}$ to be less than $V_{i(+)}$ by a value of $V_H$, e.g., $V_{d(+)}\alpha V_{i(+)}-V_H$ correspondingly, reference $V_{(-)}$ is proportional to $V_{i(-)}$. At time $t_2$, when an increasing $V_{d(+)}$ (corresponding to $V_{i(+)}-V_H$), equals $V_{d(-)}$, comparator output $V_{o(+)}$ changes from a logic level LOW state to a logic level HIGH state. This results in an increase in the amplitude of $V_{d(+)}$ a decrease in the amplitude of $V_{d(-)}$, since feedback voltage $V_{fb(-)}$ causes level shift circuit 41 to decrease $V_{d(-)}$ by $V_H$ and $V_{d(+)}$ becomes proportional to $V_{i(+)}$. At time $t_3$, when a decreasing $V_{d(+)}$ equals $V_{d(-)}$, a second logic level shift occurs, $V_{o(+)}$ level LOW state and $V_{o(-)}$ to a logic level HIGH state, thus causing the amplitude of $V_{d(-)}$ to increase and the amplitude of $V_{d(+)}$ to decrease, by $V_H$.

It should be recognized by those skilled in the art that while the above discussion refers to an equal hysteresis voltage $V_H$ shift for both $V_{d(+)}$ and $V_{d(-)}$, separate amplitudes of $V_H$ can be provided for each level shift circuit 40, 41

To examine the hysteresis process in a different context, consider the conditions of the waveforms in FIGS. 3A,3B,4A, and 4B. Initially, in FIGS. 3A and 3B prior to time $t_1$:

$V_{i(+)} < V_{i(-)}$ $V_{o(+)}=$ "0" and $V_{o(-)}=$ "1"

As shown in FIG. 4A, the feedback of the "1" on $V_{o(-)}$ deactivates level shift circuit 41 on $V_{i(-)}$ and the feedback of the "0" on $V_{o(+)}$ activates level shift circuit 40 on $V_{i(+)}$ creating the conditions shown in FIG. 4A, prior to time $t_1$ where:

$V_{d(-)}\alpha V_{i(-)}$ and $V_{d(+)}\alpha V_{i(+)}-V_H$,

This effect means satisfying the condition $V_{i(+)}=V_{i(-)}+V_H$ to produce the condition for switching $V_{o(+)}$ from "0" to "1"; e.g.

$V_{d(+)}=V_{d(-)}$ for an output switch on $V_o$ from "0" to "1." When the switch condition occurs, the output $V_{o(+)}$ will change from "0" to "1" (at time $t_2$, FIG. 4A). As $V_{o(+)}$ becomes "1," the feedback $V_{o(+)}$ deactivates the level shift (41) on $V_{i(+)}$, and the feedback of the new "0" on $V_{o(-)}$ activates the level shift (40) on $V_{i(-)}$ creating the conditions $V_{d(+)}\alpha V_{i(+)}$ $V_{d(-)}\alpha V_{i(-)}-V_H$.

In order to now produce a switch on $V_{o(+)}$ from "1" to "0" the input condition must be $V_{i(+)}=V_{i(-)}-V_H$ to gain the condition for output switching of $V_{d(+)}=V_{d(-)}$.

When the output $V_{o(+)}$ changes from "1" to "0" at time $t_3$, $V_{d(+)}$ reduces and $V_{d(-)}$ increases by the predetermined voltage $V_H$.

The aforementioned changes to level shift output voltages $V_{d(+)}$ and $V_{d(-)}$ result in the requirement that test voltage $V_{i(+)}$ be increased by the level of hysteresis voltage $V_H$ to produce the condition of output change wherein $V_{d(+)}$ equals $V_{d(-)}$. Thus, output voltage $V_0$ achieves the desired hysteresis effect with respect to input voltages $V_{i(+)}$ and $V_{i(-)}$ as shown in FIG. 5.

As discussed above, this programmable hysteresis effect is one method for reducing the effect of small oscillatory signals on slow-changing input signals from causing switching oscillations on the response of the voltage comparator at the input switching point The programmable hysteresis function described above may, when the on-chip comparators 20 are independently operated as simple comparators, be actuated by a positive feedback network external to the integrated circuit chip. However, comparator 30 with internal hysteresis is required when tne array is not configured for independent comparator operation, such as in flash analog/digital and line receiving applications.

Figure 6:
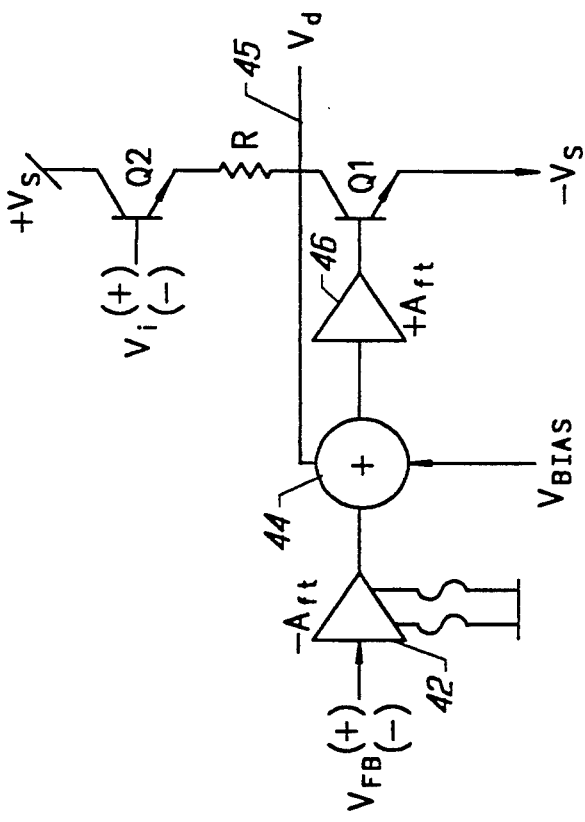
FIG. 6 is a schematic diagram of the logic shift circuitry utilized in the preferred embodiment of the analog comparator shown in FIG. 2.

The preferred embodiment of level shift circuits 40 and 41 is shown in FIG. 6. The circuit shown in FIG. 6 will produce the desired hysteresis effect shown in FIG. 5 when used on both non-inverting input 23 and inverting input 25.

As shown in FIG. 6, inverting and non-inverting feedback voltages $V_{fb(+)}$ and $V_{fb(-)}$ are input to an inverting amplifier 42 having a gain of $-A_{fb}$. Inverting amplifier 42 includes programmable fuses 43 which allow the user to selectively program gain $-A_{fb}$ of inverting amplifier 42. As discussed below, by programming the output gain of inverting amplifier 42, the amount of hysteresis on output voltage $V_0$ of the differential amplifier 35 can be selected by the user. The output of inverting amplifier 42 is provided to summing node 44. The summed voltage from summing node 44 is provided as an input to amplifier 46, having a gain of $+A_{fb}$, which provides an amplified output voltage coupled to the base of transistor Q1. Either comparator input voltage, $V_{i(+)}$ or $V_{i(-)}$, is coupled to the base of second transistor Q2. Transistor Q2 has a collector coupled to the PLD's analog supply voltage $V_s$ and an emitter coupled to a resistor R. Resistor R is also coupled to the collector of transistor Q1, and the emitter of transistor Q1 is coupled to common ($-V_s$). Resistor R and the collector of transistor Q1 are also coupled to summing node 44 and output 45. As shown in FIG. 6, output 45 and bias voltage $V_{bias}$ are also coupled to summing node 44.

In operation, if $V_{fb}$ is a logic HIGH state, the signal is provided through amplifiers 42 and 46 to the base of transistor Q1 and the voltage at $V_d$ is proportional to $V_i$. If $V_{fb}$ is a logic level LOW state, the voltage at the base of Q1, and consequently the current in the collector of Q1 will be higher than in the situation where $V_{fb}$ is HIGH. The programmer can select the value of $-A_{fb}$ for inverting amplifier 42 using fuse-programmable logic 43 and thereby adjust the current in the collector of Q1 and the value of $V_H$. By increasing the value of $-A_{fb}$ when $V_{fb}="0"$, the collector current in transistor Q1 will increase, thus reducing the value of $V_d$ and hence implementing increasing $V_H$. If fuses 43 are selected to provide a zero effect from feedback voltage $V_{fb}$, then $V_{d(-)}\alpha V_{i(-)}$, $\alpha V_{i(+)}$ and no hysteresis will be present on the output of differential amplifier 35.

Although fuses 43 are shown as the means for programming inverting amplifier 42, it will be understood by those skilled in the art that alternatives to programmable fuses may be utilized as, for example, EPROM, EEpROM or Anti-fuse cells. FIG. 6A shows one such alternative wherein EEPROMS are used to program inverting amplifier 42. In such an embodiment, as is well understood in the art, the EEPROMS may be used to program the amplification of inverting amplifier 42, and may thereafter be erased and a new programmed value set. As such, the hysteresis value may be reprogrammed by reprogramming the EEPROM in accordance with well known techniques. Furthermore, although transistors Q1 and Q2 have been described with reference to bipolar technology, it will be understood by those skilled in the art that alternative types of transistors Q1 and Q2 may be utilized within the scope of the present invention as, for example, CMOS.

In the above discussion of FIG. 6, the level shift circuit provides $V_d\alpha V_i-V_H$ when the $V_{fb}$ input is LOW. It should be recognized by those skilled in the art that level shift circuits 40 and 41 can be readily designed to be responsive to logic level HIGH output voltages to provide the $V_d$ output. In addition, it is within contemplation of the invention to provide $V_d$ outputs which increase the input voltages by $V_H$, e.g., $V_d\alpha V_i+V_h$.

The aforementioned programmable logic device results in a combination of the functions of a programmable array logic device (PAL) with the functions of a comparator to produce a versatile device for use in both analog and analog-to-digital interface applications. In the preferred embodiment of the invention, each comparator 20 utilizing internally programmable hysteresis is useful in zero cross detection, frequency doubling, voltage controlled oscillators, line driving and receiving operations, and magnetic pickup detection. These functions can be combined with the versatility and programmability of PALs to provide digital functional outputs from analog inputs; the device can provide single analog-to-digital input comparisons, functional outputs from zero cross derections, and analog-to-digital conversion to provide digital inputs for the PAL.

The invention has been described with respect to the particular embodiments thereof. Numerous variations are possible as Will be apparent to a person of ordinary skill in the art after reading the present specification. For example, though the invention has been particularly described with respect to bipolar technology, other types of semiconductor technology, such as CMOS, are equally applicable. Further, programmable hysteresis is described as enabled by fuse-programmable logic, other types of programming technology, such as EEPROMs are equally compatible. Still further, although the output blocks and a particular OR gate array structure have been particularly defined for the PAL architecture, numerous variations on the configuration of the OR array, the output blocks, and the particular method of product term sharing are possible and within the scope of the present invention. Furthermore, numerous sizes of AND gate arrays are within the contemplation of the invention as are any number of voltage comparator inputs. These variations and others are intended to be within the scope of the present invention as defined by the specification, claims and drawings.

What is claimed is:

1. A programmable voltage comparator, comprising:
   first and second input means for receiving first and second variable amplitude input voltages to be compared;
   at least one output means for outputting a logic state signal;
   means, coupled to said first and second input means, for providing said logic state signal and the inverse of said logic state signal to said at least one output means responsive to the respective amplitude of said first and second input voltages; and
   means, coupled to said first and second input means and said output means, for selectively controlling said means for providing said logic state signal such that said means for providing provides said logic state signal when the amplitude of said first input voltage has a first amplitude and said second input voltage has a second amplitude, and said inverse of said logic state signal is provided when the amplitude of said first input voltage has a third amplitude and said second input voltage has a fourth amplitude, wherein the third and fourth amplitudes are proportional to the first and second amplitudes, respectively, and said means for selectively controlling includes means for programming a first degree of proportionality between said amplitudes and selectively reprogramming said proportionality between said amplitudes to a second degree of proportionality.

2. The programmable voltage comparator of claim 1 wherein said third amplitude equals said second amplitude minus a first predetermined voltage amplitude, and said fourth amplitude equals said first amplitude minus a second predetermined voltage amplitude.

3. The programmable voltage comparator of claim 2 wherein said first predetermined voltage amplitude equals said second predetermined voltage amplitude.

4. The programmable voltage comparator of claim 1 wherein said means for providing a logic state signal comprises a differential amplifier having a rest input coupled to said means for selectively controlling for receiving a test input voltage, a reference input coupled to said means for selectively controlling for receiving a reference input voltage, an inverting output and a non-inverting output, the inverting and non-inverting outputs being coupled to said output means, said non-inverting output for providing a signal comprising said logic state signal or said inverse of said logic state signal, and said inverting output for providing the inverse of the signal provided at said non-inverting output.

5. The programmable voltage comparator of claim 4 wherein said means for selectively controlling is coupled between said test input and said first input means, and said reference input and said second input means, and
  provides a test input voltage to said test input in response to said first variable amplitude input voltage and said logic state signal, and
  provides a reference input voltage to said reference input in response to said second variable amplitude input voltage and said logic state signal.

6. The programmable voltage comparator of claim 4 wherein said means for selectively controlling comprises
  a first level shift circuit coupled to said first input means and said test input, and
  a second level shift circuit coupled to said second input means and said reference input, said first and second level shift circuit including means for selecting a first and second amount of level shift, and reselecting the amounts of level shift of the said first and second level shift circuits to at least a third and fourth amount of level shift, respectively.

7. The programmable voltage comparator of claim 6 wherein said non-inverting and inverting outputs are provided to said first and second level shift circuits, respectively.

8. The programmable voltage comparator of claim 7 wherein said first level shift circuit comprises
  first and second amplifiers each having an input and output, said first amplifier comprising an inverting amplifier, said input of said first amplifier being coupled to said non-inverting output, said first amplifier further including erasable means for programming the output gain of said first amplifier;
  a summing means for summing a plurality of voltages, including a plurality of inputs, one of said plurality of inputs being coupled to said output of said first amplifier and another of said plurality of inputs being coupled to a bias voltage, said summing means further having an output coupled to said input of said second amplifier for providing a summed voltage to said second amplifier;
  first and second transistors each having a base, emitter, and collector, wherein said base of said first transistor is coupled to said output of said second amplifier, said base of said second transistor is coupled to said first input means, and said collector of said second transistor is coupled to a chip supply voltage; and
  a resistor having one end coupled to said emitter of said second transistor, and having a second end coupled to said collector of said first transistor, one of said summing means inputs, and a conductor, the conductor being coupled to said test input.

9. The programmable voltage comparator of claim 7 wherein said second level shift circuit comprises
  first and second amplifiers each having an input and output, said first amplifier comprising an inverting amplifier, said input of said first amplifier being coupled to said inverting output, said first amplifier further including means for programming the output gain of said first amplifier;
  a summing means for summing a plurality of voltages, including a plurality of inputs, one of said plurality of inputs being coupled to said output of said first amplifier and another of said plurality of inputs being coupled to a bias voltage, said summing means further having an output coupled to said input of said second amplifier for providing a summed voltage to said second amplifier;
  first and second transistors each having a gate, source, and drain, wherein said gate of said first transistor is coupled to said output of said second amplifier, said gate of said second transistor is coupled to said second input means, and said source of said second transistor is coupled to a chip supply voltage; and
  a resistor having one end coupled to said drain of said second transistor, and having a second end coupled to said source of said first transistor, one of said summing means inputs, and a conductor, the conductor being coupled to said reference input.

10. A voltage comparator having a programmable hysteresis function, comprising:
  first and second input means for receiving a first and second variable amplitude input voltages;
  an output means;
  means, coupled to said first and second input means, for outputting a logic state signal to said output means responsive to the relative amplitudes of said first and second input voltages, wherein said logic state signal comprises a first state when the amplitude of said first input voltage equals the amplitude of said second input voltage plus a predetermined voltage amplitude, and comprises a second state when the amplitude of said first input voltage equals the amplitude of said second input voltage minus a predetermined voltage amplitude; and
  erasable means, coupled to said means for outputting and said first and second input means, for selecting a first predetermined voltage amplitude and for selectively providing said first predetermined voltage amplitude to said means for outputting responsive to said state signal to control the state of said logic state signal, said erasable means being erasable to allow selection of a second predetermined voltage amplitude.

11. The voltage comparator of claim 10 wherein said means for outputting a state signal comprises a differential amplifier having an non-inverting input and an inverting input coupled to said means for selecting.

12. The voltage comparator of claim 11 wherein said means for selecting includes, respectively, a first output coupled to said non-inverting input for providing a first offset voltage equivalent to said first input voltage minus said predetermined voltage level when said means for outputting a state signal outputs said first state signal, and a second output coupled to said inverting input for providing a second offset voltage equivalent to said second input voltage minus said predetermined voltage level when said means for outputting a state signal outputs said second state signal.

13. The voltage comparator of claim 12 wherein said differential amplifier includes non-inverting and inverting outputs comprising said output means, wherein said non-inverting output provides said first and second state signals, and said inverting output provides a signal which is the logical inverse of said first and second state signals.

14. The voltage comparator of claim 13 wherein said first offset output is responsive to said non-inverting output and said second offset output is responsive to said inverting output.

15. A voltage comparator having a programmable hysteresis function, comprising:
first and second input means for receiving a first and second variable amplitude input voltages;
an output means;
means, coupled to said first and second input means, for outputting a logic state signal to said output means responsive to the relative amplitudes of said first and second input voltages, wherein said logic state signal comprises a first state when the amplitude of said first input voltage equals the amplitude of said second input voltage plus a predetermined voltage amplitude, and comprises a second state when the amplitude of said first input voltage equals the amplitude of said second input voltage minus a predetermined voltage amplitude; and
means, coupled to said means for outputting and said first and second input means, for selecting the predetermined voltage amplitude and for selectively providing said predetermined voltage amplitude to said means for outputting responsive to said state signal to control the state of said logic state signal, wherein said means for selecting comprises an electrically erasable programmable read only memory cell.

16. A voltage comparator comprising:
first and second voltage inputs;
a differential amplifier having a non-inverting input, an inverting input, a non-inverting output for providing a logic state signal output, and an inverting output for providing the inverse of said logic state signal output;
programmable voltage shift circuitry coupled between said first voltage input and said non-inverting input and said second voltage input and inverting input, respectively, and including feedback circuitry to said non-inverting and inverting outputs, for increasing or decreasing the amplitude of the voltage applied to said non-inverting input by a selected offset voltage level responsive to said non-inverting output, and for increasing or decreasing the amplitude of the voltage applied to said inverting input by a selected offset voltage level responsive to said inverting output and wherein said programmable voltage shift circuitry includes means for selecting a first level of said offset voltage and for reprogramming said voltage shift circuitry to select a second level of said offset voltage.

17. The voltage comparator of claim 16 wherein said differential amplifier outputs said logic state signal to said non-inverting output when the amplitude of said first input voltage is greater-than or equal-to the amplitude of said second input voltage plus a first offset voltage, and said differential amplifier outputs the inverse of said logic state signal to said non-inverting output when the amplitude of said first input voltage is less than or equal to said second input voltage minus a second offset voltage.

18. A voltage comparator comprising:
first and second voltage inputs;
a differential amplifier having a non-inverting input, an inverting input, a non-inverting output for providing a logic state signal output, and an inverting output for providing the inverse of said logic state signal output;
programmable voltage shift circuitry coupled between said first voltage input and said non-inverting input and said second voltage input and inverting input, respectively, and including feedback circuitry coupled to said non-inverting and inverting outputs, for increasing or decreasing the amplitude of the voltage applied to said non-inverting input by a selected offset voltage level responsive to said non-inverting output, and for increasing or decreasing the amplitude of the voltage applied to said inverting input by a selected offset voltage level responsive to said inverting output and wherein said programmable voltage shift circuitry includes means for selecting the level of said offset voltage, wherein said means for selecting comprises an electrically erasable programmable read-only memory cell.

19. In a programmable array logic (PAL) device, a plurality of voltage comparators, each of said plurality of voltage comparators generating an output signal responsive to first and second input voltage wherein said output signal exhibits a hysteresis effect with respect to the input voltages applied to each said comparator, each of said plurality of comparators comprising:
first and second voltage input means for receiving a first and second input voltages;
a first voltage level shift circuit, coupled to said first voltage input means, generating a first modified voltage and including an amplifier having programmable gain which is proportional with the first modified voltage;
a second voltage level shift circuit coupled to said second voltage input means, generating a second modified voltage and including an amplifier having programmable gain which is proportional with the second modified voltage;
a differential amplifier having a non-inverting and an inverting input, said first and second modified voltages being coupled to said inverting and non-inverting inputs, respectively, said differential amplifier further having at least one output; and
feedback means coupled between said at least one output and said first and second voltage level shift circuits.

20. The plurality of voltage comparators as claimed in claim 19 wherein each said comparator further includes means coupled to said first and second voltage level shift circuits for selectively programming the gain of the amplifiers and thereby said first and second modified voltages.

21. The plurality of voltage comparators as claimed in claim 19 wherein each said differential amplifier includes both a non-inverting output and an inverting output coupled to said first and second voltage level shift circuits, respectively.

22. An apparatus, comprising:
means for providing first and second analog input voltages; and
means, coupled to said means for providing, for generating a third and fourth analog voltages proportional to said first and second input voltages, respectively, and for comparing the relative amplitudes of said third and fourth voltages for providing a logic state output based on the relative amplitudes of said third and fourth voltages, wherein the third analog voltage is equivalent to the first analog voltage with a first selected offset, and the fourth voltage is equivalent to the second analog voltage with a second selected offset, and means for programming the first and second selected offsets, and for reprogramming the said first and second selected offsets to a third and fourth selected offset, respectively.

23. The apparatus of claim 22 wherein said means for programming is responsive to said logic state output.

24. A voltage comparator comprising:
first and second voltage inputs;
a differential amplifiers having a non-inverting input, an inverting input, a non-inverting output for providing a logic state signal output, and an inverting output for providing the inverse of said logic state signal output;
programmable voltage shift circuitry coupled between said first voltage input and said non-inverting input and said second voltage input and inverting input, respectively, and including feedback circuitry coupled to said non-inverting and inverting outputs, for increasing or decreasing the amplitude of the voltage applied to said non-inverting input by a selected offset voltage level responsive to said non-inverting output, and for increasing or decreasing the amplitude of the voltage applied to said inverting input by a selected offset voltage level responsive to said inverting output and wherein said programmable voltage shift circuitry includes means for selecting the level of said offset voltage, wherein said means for selecting comprises fuse programmable logic.

* * * * *